(12) United States Patent
Noma et al.

(10) Patent No.: US 8,981,441 B2
(45) Date of Patent: Mar. 17, 2015

(54) MAGNETIC MEMORY AND MANUFACTURING METHOD THEREOF

(71) Applicant: Kabushiki Kaisha Toshiba, Minato-ku (JP)

(72) Inventors: Kenji Noma, Yokohama (JP); Hiroshi Watanabe, Yokohama (JP); Shinya Kobayashi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/041,382

(22) Filed: Sep. 30, 2013

(65) Prior Publication Data
US 2014/0027870 A1    Jan. 30, 2014

Related U.S. Application Data

(62) Division of application No. 13/235,406, filed on Sep. 18, 2011, now Pat. No. 8,574,926.

(30) Foreign Application Priority Data

Mar. 23, 2011 (JP) ................... 2011-064927

(51) Int. Cl.

| H01L 29/76 | (2006.01) |
|---|---|
| H01L 29/94 | (2006.01) |
| H01L 31/062 | (2012.01) |
| H01L 31/113 | (2006.01) |
| H01L 31/119 | (2006.01) |
| H01L 29/82 | (2006.01) |
| H01L 27/105 | (2006.01) |
| H01L 27/22 | (2006.01) |
| H01L 43/08 | (2006.01) |
| H01L 43/12 | (2006.01) |
| H01F 41/30 | (2006.01) |

(52) U.S. Cl.
CPC .............. *H01L 29/82* (2013.01); *H01L 27/105* (2013.01); *H01L 27/228* (2013.01); *H01L 43/08* (2013.01); *H01L 43/12* (2013.01); *H01F 41/307* (2013.01)
USPC ............ 257/295; 257/E21.006; 257/E21.027; 257/E21.058; 257/E21.134; 257/E21.206; 257/E21.218; 257/E21.231; 257/E21.267; 257/E21.278; 257/E21.293; 257/E21.304

(58) Field of Classification Search
USPC ......... 257/295, 296, 288, 396, 421, 427, 428, 257/E21.006, E21.027, E21.058, E21.134, 257/E21.206, E21.218, E21.231, E21.267, 257/E21.278, E21.293, E21.304
See application file for complete search history.

(56) References Cited

U.S. PATENT DOCUMENTS

| 6,792,670 B2* | 9/2004 | Sato et al. ................... 29/603.15 |
|---|---|---|
| 6,842,317 B2* | 1/2005 | Sugita et al. ............... 360/324.2 |
| 6,943,041 B2* | 9/2005 | Sugita et al. ...................... 438/3 |
| 8,391,041 B2* | 3/2013 | Okayama ........................ 365/51 |
| 8,575,926 B2* | 11/2013 | Chao et al. .................... 324/244 |

FOREIGN PATENT DOCUMENTS

JP        2010-118542        5/2010

* cited by examiner

*Primary Examiner* — David Nhu
(74) *Attorney, Agent, or Firm* — Oblon, McClelland, Maier & Neustadt, L.L.P.

(57) ABSTRACT

According to one embodiment, a manufacturing method of a magnetic memory includes forming a magnetoresistive element in a cell array section on a semiconductor substrate, forming a dummy element in a peripheral circuit section on the semiconductor substrate, the dummy element having the same stacked structure as the magnetoresistive element and being arranged at the same level as the magnetoresistive element, collectively flattening the magnetoresistive element and the dummy element, applying a laser beam to the dummy element to form the dummy element into a non-magnetic body, and forming an upper electrode on the flattened magnetoresistive element.

4 Claims, 20 Drawing Sheets

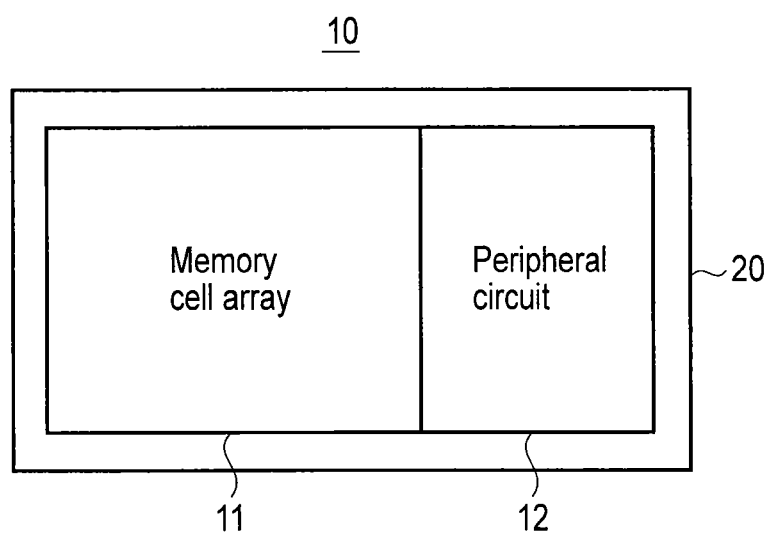
F I G. 1

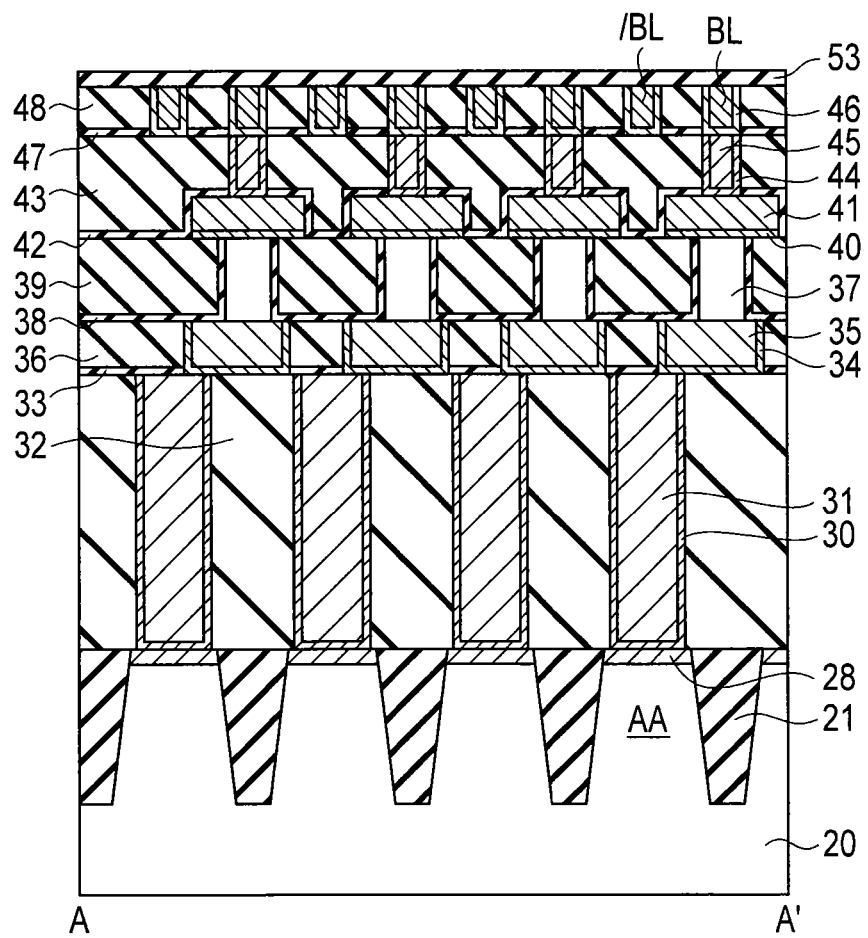
F I G. 3

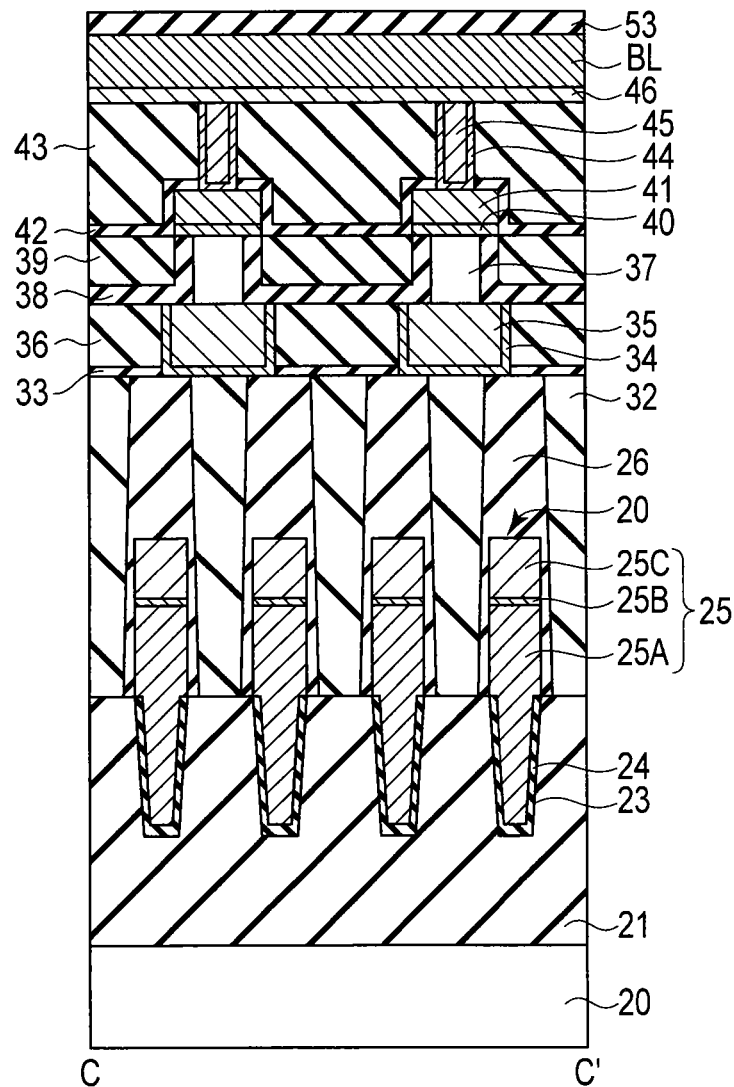
F I G. 5

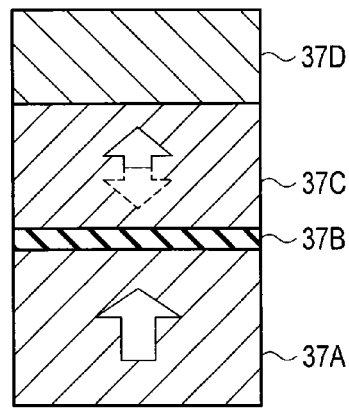
F I G. 6
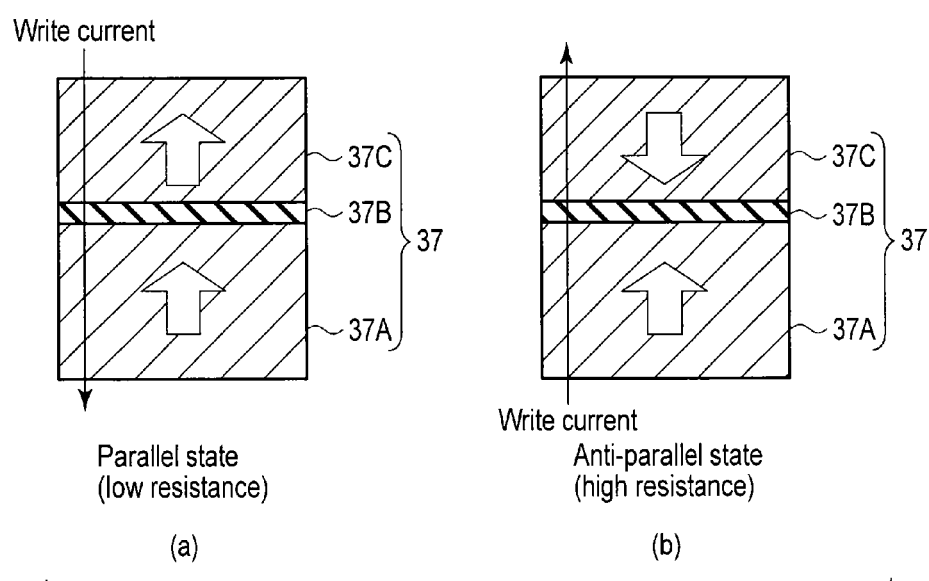
F I G. 7

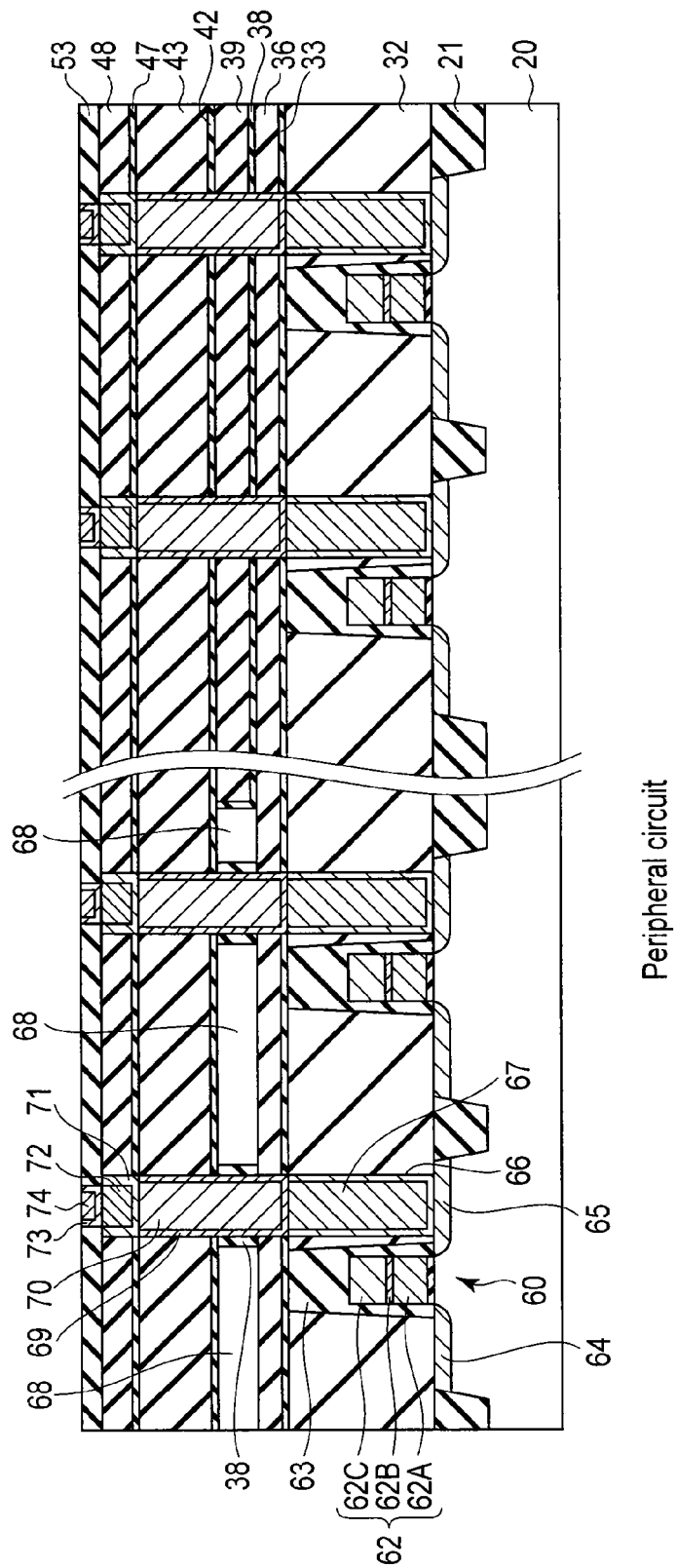
F I G. 8

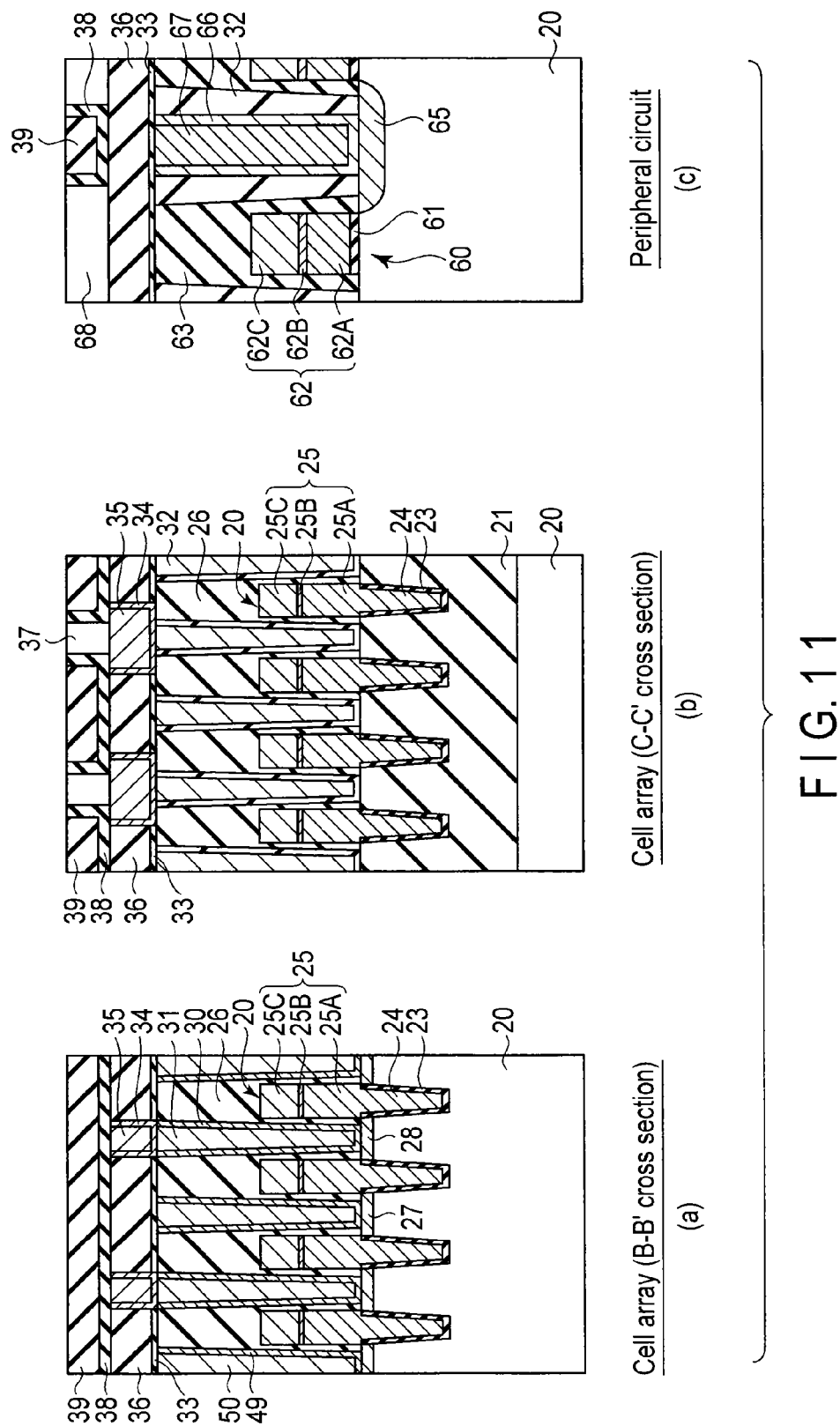
F I G. 11

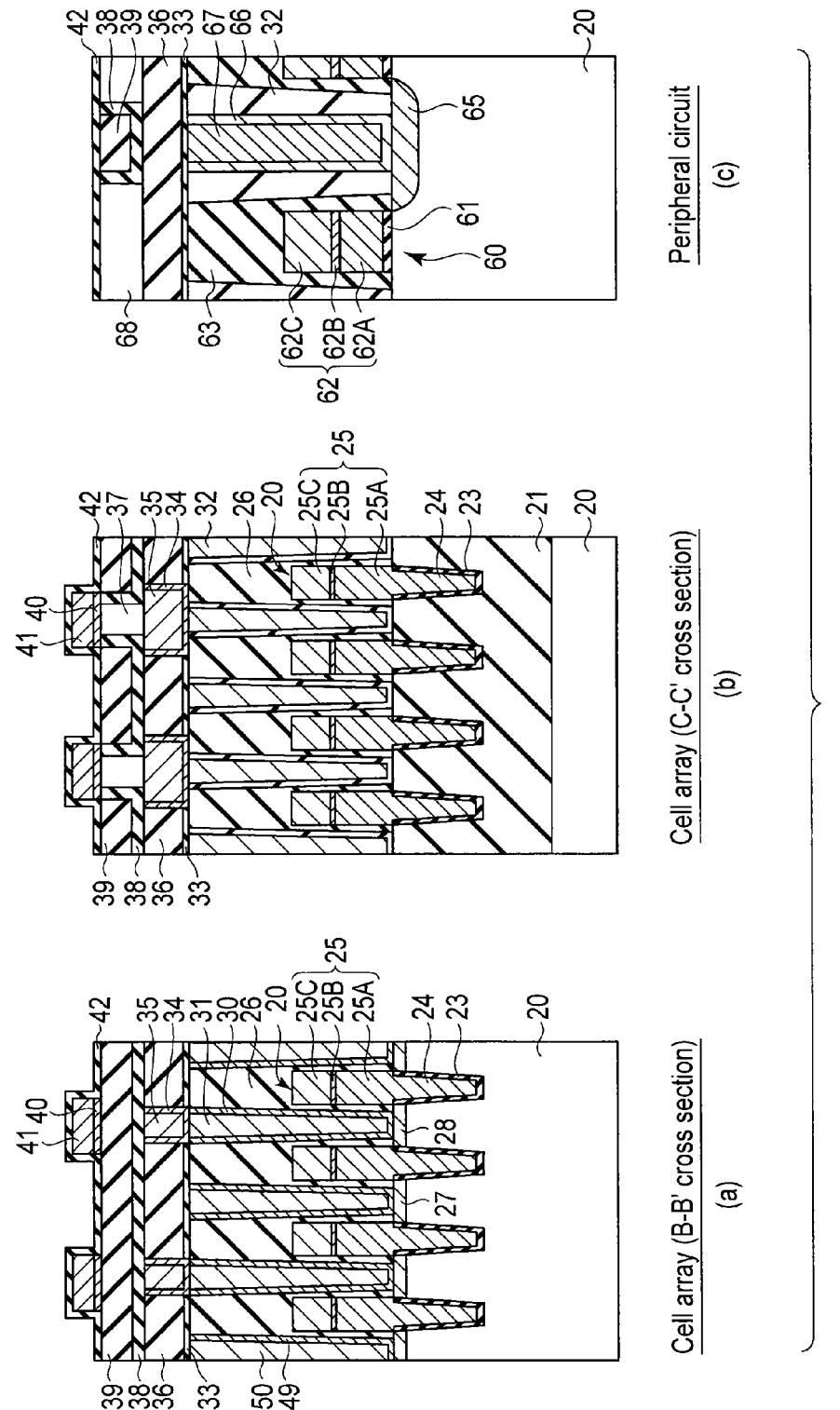
F I G. 15

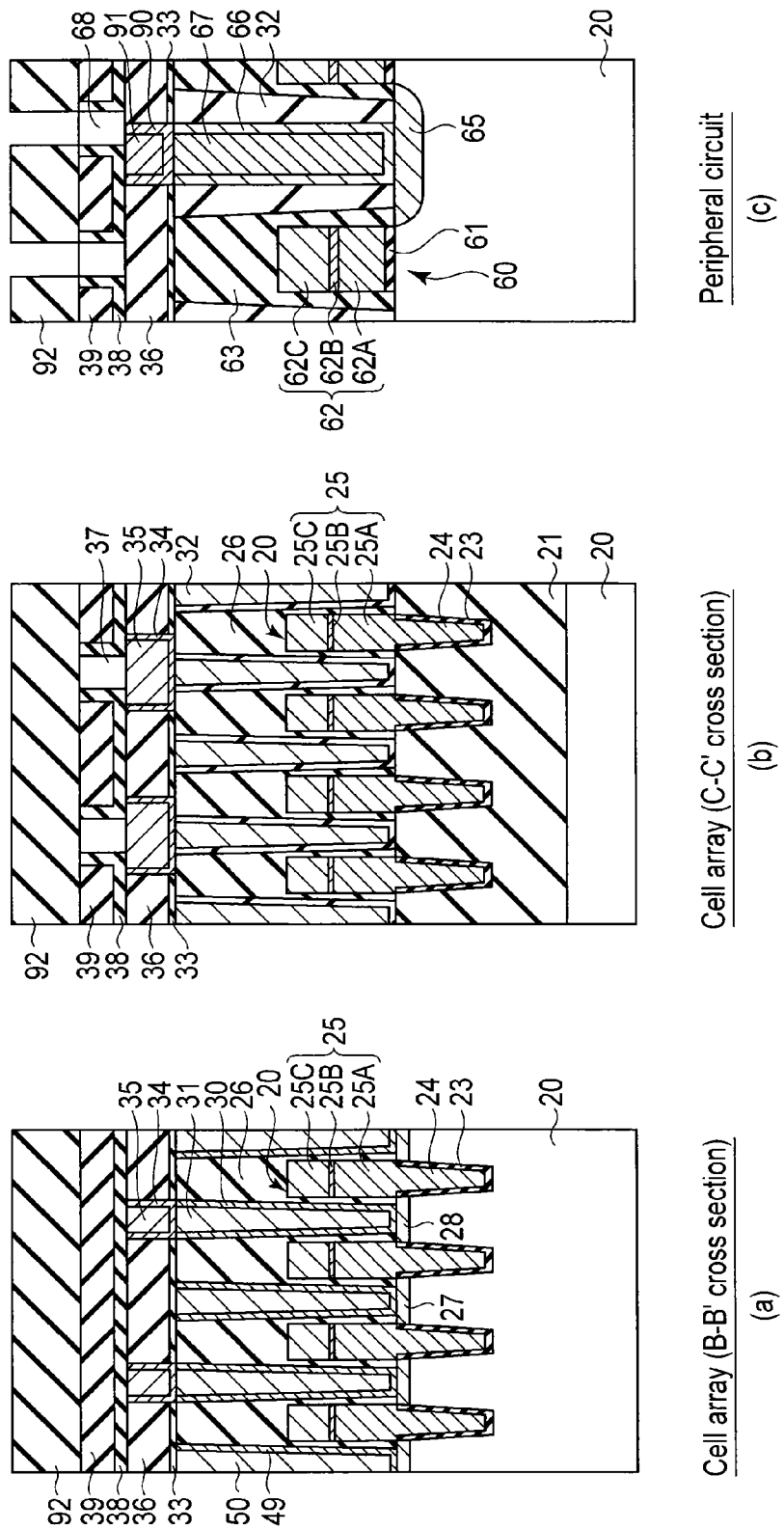
F I G. 19

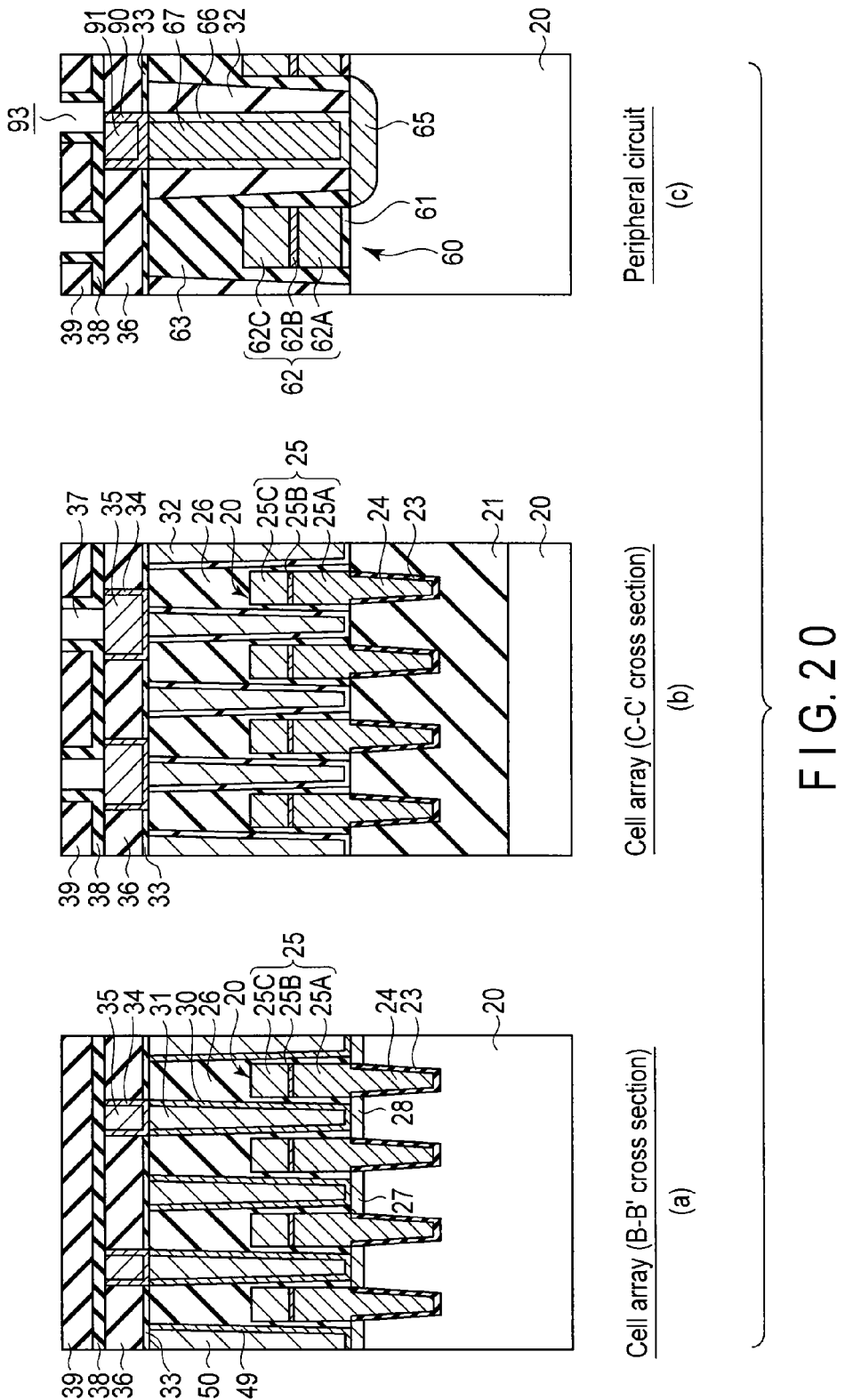
F I G. 20

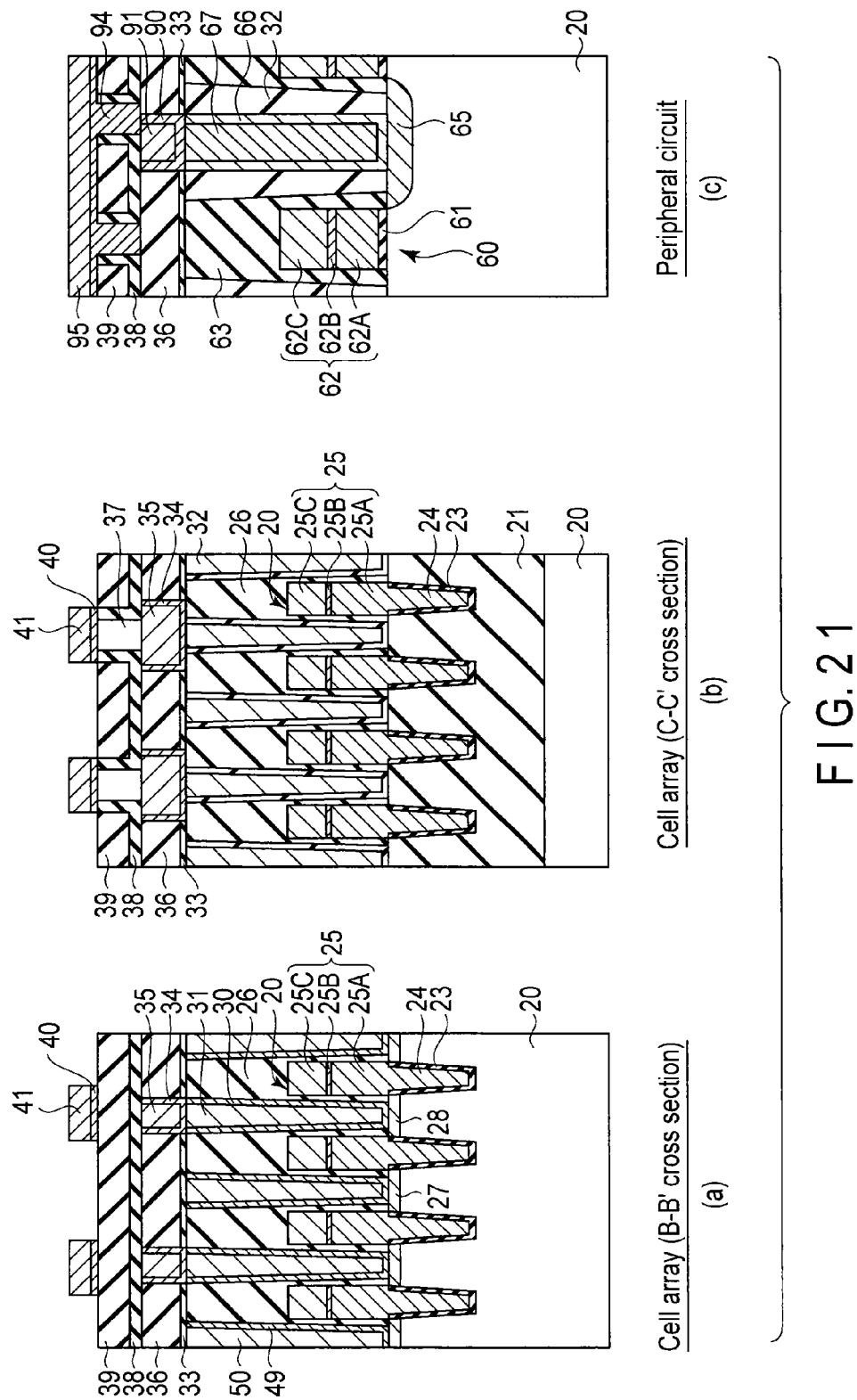
F I G. 21

US 8,981,441 B2

MAGNETIC MEMORY AND MANUFACTURING METHOD THEREOF

CROSS-REFERENCE TO RELATED APPLICATIONS

This application is a division of and claims the benefit of priority under 35 U.S.C. §120 from U.S. Ser. No. 13/235,406 filed Sep. 18, 2011 (now U.S. Pat. No. 8,574,926 issued Nov. 5, 2013), and claims the benefit of priority under 35 U.S.C. §119 from Japanese Patent Application No. 2011-064927 filed Mar. 23, 2011, the entire contents of each of which are incorporated herein by reference.

FIELD

Embodiments described herein relate generally to a magnetic memory and a manufacturing method thereof.

BACKGROUND

In recent years, as one of next-generation nonvolatile semiconductor memories, there is a magnetic random access memory (MRAM). The MRAM comprises an MTJ (Magnetic Tunnel Junction) element as a memory element, and the MTJ element has a stacked structure including a reference layer having an invariable spin direction, a recording layer having a spin direction that is variable according to, e.g., a write current, and a barrier layer provided between the reference layer and the recording layer. The MTJ element has low resistance when the spin directions of the reference layer and the recording layer are parallel to each other or has high resistance when these directions are anti-parallel, and it stores 1-bit data (data "0" and "1") by utilizing a difference in current produced by a difference between these electrical resistances.

In such an MRAM, embedded use by mixing with other types of memory products is expected, and a reduction in chip size (layout) is desired in view of an increase in speed or a reduction in size of an entire system. On the other hand, when a layout is reduced, crosstalk (a current leak) between wiring lines is induced in a cell array section and a peripheral circuit section, and a manufacturing process having a small variation in transistor size is required to reduce a current leak.

The MRAM manufacturing process includes a process of flattening an upper surface of the MTJ element. At this time, since a covering rate of the MTJ element with respect to the cell array section and the peripheral circuit section is very low, there is a problem that processing with higher flatness is difficult. Low flatness of the MTJ element leads to a problem that deterioration of contact properties and a current leak between adjacent transistors are induced when an upper electrode or an upper wiring layer is formed on the MTJ element.

BRIEF DESCRIPTION OF THE DRAWINGS

FIG. 1 is an overall view of an MRAM according to a first embodiment;
FIG. 3 is a cross-sectional view of the memory cell array taken along a line A-A' of FIG. 2;
FIG. 5 is a cross-sectional view of the memory cell array taken along a line C-C' of FIG. 2;
FIG. 6 is a schematic view showing a configuration of the MTJ element;
FIG. 7 is a view for explaining a write operation of the MTJ element;
FIG. 8 is a cross-sectional view showing a configuration of a peripheral circuit;
FIG. 11 is a view showing a manufacturing step of the MRAM continued from FIG. 10;
FIG. 15 is a view showing a manufacturing step of the MRAM continued from FIG. 14;
FIG. 19 is a view showing a manufacturing step of an MRAM according to a second embodiment;
FIG. 20 is a view showing a manufacturing step of the MRAM continued from FIG. 19;
and
FIG. 21 is a view showing a manufacturing step of the MRAM continued from FIG. 20.

DETAILED DESCRIPTION

Figure 2:
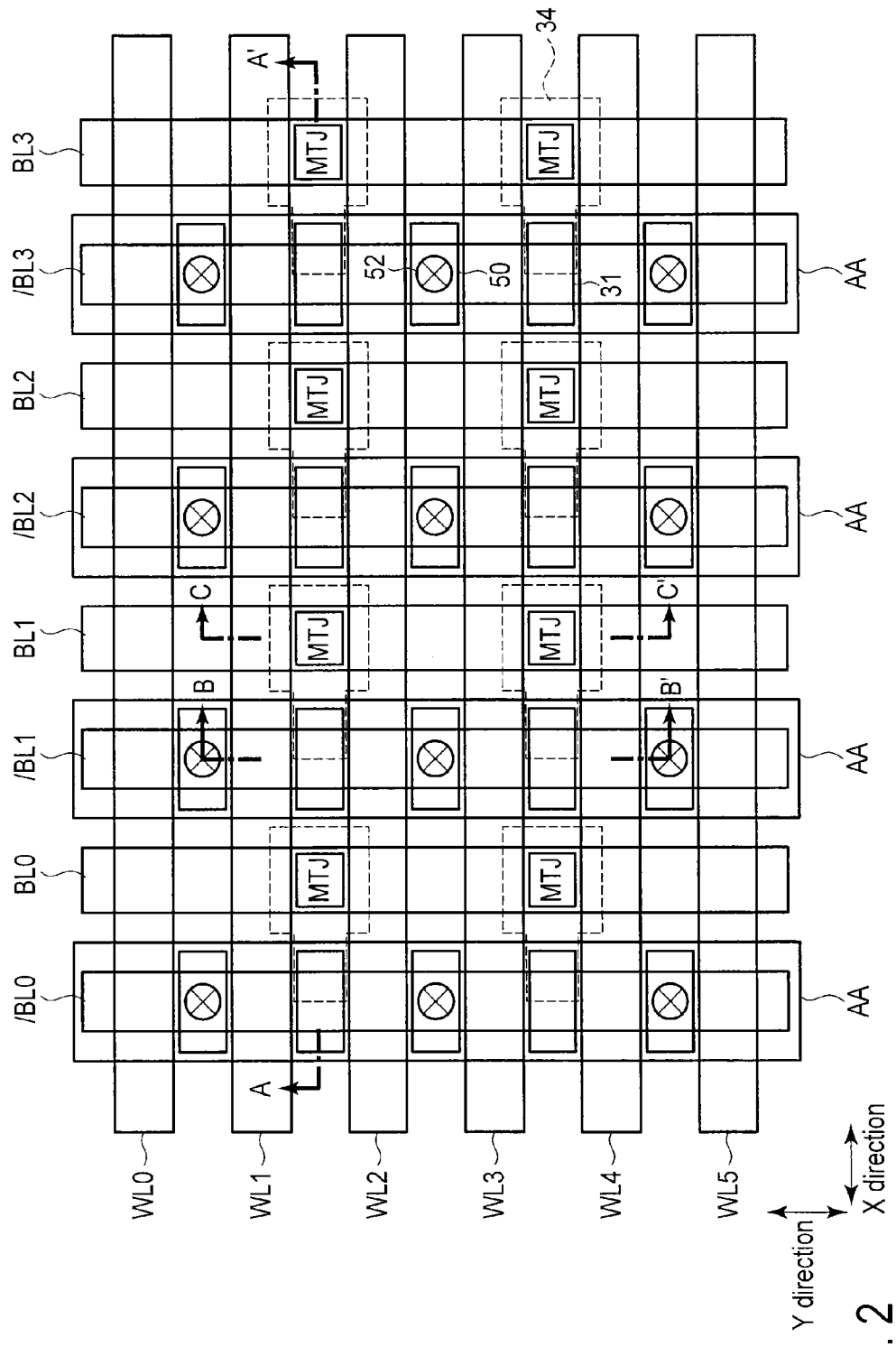
FIG. 2 is a plan view of a memory cell array.

In general, according to one embodiment, there is provided a manufacturing method of a magnetic memory, the method comprising:
forming a magnetoresistive element in a cell array section on a semiconductor substrate;
forming a dummy element in a peripheral circuit section on the semiconductor substrate, the dummy element having the same stacked structure as the magnetoresistive element and being arranged at the same level as the magnetoresistive element;
collectively flattening the magnetoresistive element and the dummy element;
applying a laser beam to the dummy element to form the dummy element into a non-magnetic body; and
forming an upper electrode on the flattened magnetoresistive element.

The embodiments will be described hereinafter with reference to the accompanying drawings. In the description which follows, the same or functionally equivalent elements are denoted by the same reference numerals, to thereby simplify the description.

[First Embodiment]

FIG. 1 is an overall view of an MRAM (a magnetic memory) 10 according to a first embodiment. The MRAM 10 comprises a memory cell array 11 in which memory cells MC are arrayed in a matrix form and a peripheral circuit 12. The peripheral circuit 12 is electrically connected to the memory cell array 11 to control operations of the memory cell array 11. Specifically, the peripheral circuit 12 includes a MOS transistor configured to supply a current to the memory cells MC. The memory cell array 11 and the peripheral circuit 12 are formed on the same semiconductor substrate 20.

Figure 4:
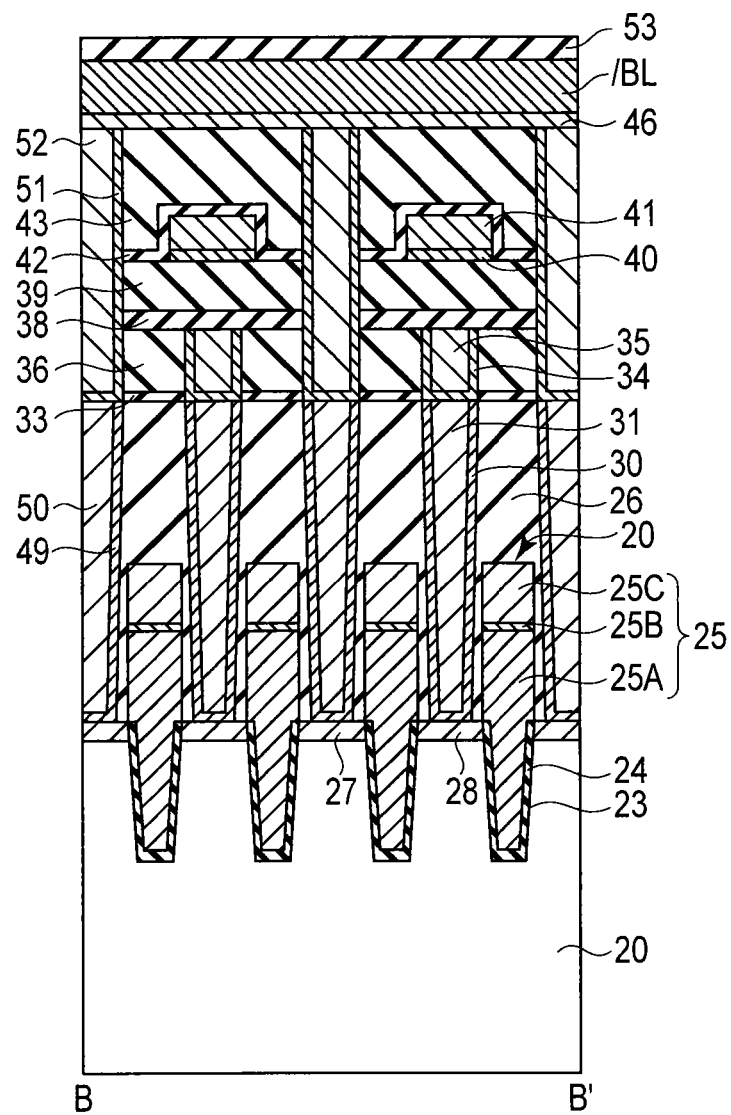
FIG. 4 is a cross-sectional view of the memory cell array taken along a line B-B' of FIG. 2.

FIG. 2 is a plan view of the memory cell array 11. FIG. 3 is a cross-sectional view of the memory cell array 11 taken along a line A-A' of FIG. 2. FIG. 4 is a cross-sectional view of the memory cell array 11 taken along a line B-B' of FIG. 2. FIG. 5 is a cross-sectional view of the memory cell array 11 taken along a line C-C' of FIG. 2.

Word lines WL extending in an X direction and bit line pairs BL and /BL extending in a Y direction are arranged in the memory cell array 11. FIG. 2 shows an example of word lines WL0 to WL5 and bit line pairs BL0, /BL0 to BL3, /BL3.

Element isolation insulating layers 21 are provided in a surface region of the p-type semiconductor substrate (e.g., a silicon substrate) 20, and each portion where the element isolation insulating layer 21 is not provided in the surface region of the semiconductor substrate 20 is an element region (an active region) AA. The element isolation insulating layer 21 is constituted of, e.g., an STI (Shallow Trench Isolation). For example, a silicon oxide ($SiO_2$) is used for the element isolation insulating layer 21.

A select transistor 22 using, e.g., an n-channel MOSFET (Metal Oxide Semiconductor Field Effect Transistor) is provided on the semiconductor substrate 20. As the select transistor 22, for example, a recess channel array transistor (RCAT) is used. It is to be noted that the select transistor 22 is not restricted to the RCAT, and a planar structure type MOSFET may be adopted. The RCAT has a configuration that a recess is formed in the semiconductor substrate and polysilicon for a gate is buried in this recess.

Specifically, as shown in FIG. 4, recesses 23 extending in the X direction are formed in the semiconductor substrate 20, and gate insulating films 24 are provided in the recesses 23. Conductive polysilicon electrodes 25A are provided on the gate insulating films 24 to fill the recesses 23. Metal gate electrodes 25C are provided on the polysilicon electrodes 25A through conductive barrier films 25B. The polysilicon electrode 25A, the barrier film 25B, and the metal gate electrode 25C function as a gate electrode 25 of the select transistor 22, and this gate electrode 25 is associated with the word line WL. For example, tungsten (W) is used for the metal gate electrode 25C. For example, a tungsten nitride (WN) is used for the barrier film 25B. An upper surface and a side surface of each gate electrode 25 are covered with a gate cap layer 26 using, e.g., a silicon nitride (SiN). A source region 27 and a drain region 28 of the select transistor 22 are provided in the active regions AA on both sides of each gate electrode 25. An n-type diffusion region is used for each of the source region 27 and the drain region 28.

A cell contact 31 having a bottom surface and a side surface covered with a barrier film 30 is provided on each drain region 28. For example, tungsten (W) is used for the cell contact 31. For example, a tungsten nitride (WN) is used for the barrier film 30. Each interlayer insulating layer 32 using, e.g., a silicon oxide ($SiO_2$) is provided between the barrier films 30. A protective film 33 using, e.g., a silicon nitride (SiN) is provided on the interlayer insulating layers 32.

A lower electrode 35 having a bottom surface and a side surface covered with a barrier film 34 is provided on each cell contact 31. In this embodiment, the lower electrode 35 has, e.g., a T-like shape. For example, titanium (Ti) is used for the lower electrode 35. For example, a titanium nitride (TiN) is used for the barrier film 34. An interlayer insulating layer 36 using, e.g., a silicon oxide ($SiO_2$) is provided between the barrier films 34.

An MTJ element (magnetoresistive element) 37 is provided on each lower electrode 35. A planar shape of the MTJ element 37 is not restricted in particular. For example, the planar shape may be a square, a circle, or an ellipse.

FIG. 6 is a schematic view showing a configuration of the MTJ element 37. The MTJ element 37 is constituted by sequentially stacking a reference layer (which will be also referred to as a fixed layer) 37A, a non-magnetic layer 37B, and a recording layer (which will be also referred to as a memory layer or a free layer) 37C. It is to be noted that the stacking order may be reversed. A hard mask layer 37D which functions as a mask at a processing step for the MTJ element or a stopper when flattening the MTJ element is provided on the recording layer 37C. For example, tantalum (Ta) is used for the hard mask layer 37D.

Each of the recording layer 37C and the reference layer 37A contains a ferromagnetic material. Each of the recording layer 37C and the reference layer 37A has magnetic anisotropy in a direction perpendicular to a film surface, and a magnetization direction of each of these layers is perpendicular to the film surface. That is, the MTJ element 37 is a so-called perpendicular magnetization MTJ element in which magnetization directions of the recording layer 37C and the reference layer 37A are perpendicular to their film surfaces. It is to be noted that the MTJ element 37 may be an in-plane magnetization MTJ element whose magnetization direction is horizontal to its film surface.

A magnetization (spin) direction of the recording layer 37C is variable (reversible). A magnetization direction of the reference layer 37A is invariable (fixed). The reference layer 37A is set to have vertical magnetic anisotropic energy sufficiently larger than that of the recording layer 37C. The magnetic anisotropy can be set by adjusting a material configuration or a film thickness. In this manner, a magnetization reversal current in the recording layer 37C is reduced, and a magnetization reversal current in the reference layer 37A is increased to be higher than that in the recording layer 37C. As a result, it is possible to realize the MTJ element 37 comprising the recording layer 37C having the variable magnetization direction and the reference layer 37A having the invariable magnetization direction with respect to a predetermined write current.

As the non-magnetic layer 37B, a non-magnetic metal, a non-magnetic semiconductor, or an insulator can be used. The non-magnetic layer 37 is called a tunnel barrier layer when the insulator is used for this layer, and the non-magnetic layer 37B is called a spacer layer when a metal is used for the non-magnetic layer 37B.

This embodiment adopts a spin injection write system that is configured to directly flow a write current through the MTJ element 37 and to control a magnetization configuration of the MTJ element 37 by using this write current. The MTJ element 37 can take one of two states, i.e., a low-resistance state and a high-resistance state depending on whether a relative relationship of magnetization between the recording layer 37C and the reference layer 37A is parallel or anti-parallel.

As shown in FIG. 7(a), when a write current is flowed through the MTJ element 37 from the recoding layer 37C toward the reference layer 37A, the relative relationship of magnetization between the recording layer 37C and the reference layer 37A becomes parallel. In this parallel state, the MTJ element 37 has the lowest resistance value. That is, the MTJ element 37 is set to the low-resistance state. The low-resistance state of the MTJ element 37 is defined as, e.g., data "0".

On the other hand, as shown in FIG. 7(b), when a write current is flowed through the MTJ element 37 from the reference layer 37A toward the recording layer 37C, the relative relationship of magnetization between the recording layer 37C and the reference layer 37A becomes anti-parallel. In this anti-parallel state, the MTJ element 37 has the highest resistance value. That is, the MTJ element 37 is set to the high-resistance state. The high-resistance state of the MTJ element 37 is defined as, e.g., data "1". As a result, the MTJ element 37 can be used as a memory element that can store 1-bit data (binary data).

A protective film 38 made of, e.g., a silicon nitride (SiN) is provided on a side surface of each MTJ element 37, an upper surface of each lower electrode 35, and an upper surface of each interlayer insulating layer 36. An interlayer insulating layer 39 that is made of, e.g., a silicon oxide ($SiO_2$) is provided between the MTJ elements 37.

An upper electrode 41 having a bottom surface covered with a barrier film 40 is provided on each MTJ element 37. For example, titanium (Ti) is used for the upper electrode 41. For example, a titanium nitride (TiN) is used for the barrier film 40. A protective film 42 that is made of, e.g., a silicon nitride (SiN) is provided on each upper electrode 41 and each interlayer insulating layer 39. An interlayer insulating layer 43 that is made of, e.g., a silicon oxide ($SiO_2$) is provided on the protective film 42.

Bit line contacts 45 each having a bottom surface and a side surface covered with a barrier film 44 are provided in the interlayer insulating layer 43 to reach the upper electrodes 41. For example, tungsten (W) is used for each bit line contact 45. For example, a tungsten nitride (WN) is used for the barrier film 44.

A protective film 47 that is made of, e.g., a silicon nitride (SiN) is provided on the interlayer insulating layer 43. An interlayer insulating layer 48 that is made of, e.g., a silicon oxide ($SiO_2$) is provided on the protective film 47. Bit lines BL each having a bottom surface and a side surface covered with a barrier film 46 are provided in the interlayer insulating layer 48 to reach the bit line contacts 45. For example, copper (Cu) is used for the bit lines BL. For example, a titanium nitride (TiN) is used for the barrier film 46.

Cell contacts 50 each having a bottom surface and a side surface covered with a barrier film 49 are provided in the interlayer insulating layer 32 to reach the source regions 27. For example, tungsten (W) is used for the cell contacts 50. For example, a tungsten nitride (WN) is used for the barrier film 49.

Bit line contacts 52 each having a bottom surface and a side surface covered with a barrier film 51 are provided on the cell contacts 50. For example, tungsten (W) is used for the bit line contacts 52. For example, a tungsten nitride (WN) is used for the barrier film 51.

Bit lines /BL each having a bottom surface and a side surface covered with the barrier film 46 are provided on the bit line contacts 52. Each bit line /BL is formed of a wiring layer that is on the same level as each bit line BL. For example, copper (Cu) is used for the bit lines /BL. A protective film 53 that is made of, e.g., a silicon nitride (SiN) is provided on the bit line pairs BL and /BL and the interlayer insulating layer 48.

A configuration of the peripheral circuit 12 will now be described. As explained above, the memory cell array 11 and the peripheral circuit 12 are formed on the same semiconductor substrate 20. Since the peripheral circuit 12 is formed in the same manufacturing process as the memory cell array 11, arrangement of interlayer insulating layers, protective films, and others in the peripheral circuit section is the same as that in the memory cell array 11.

FIG. 8 is a cross-sectional view showing a configuration of the peripheral circuit 12. The peripheral circuit 12 includes a MOS transistor configured to supply a current to the memory cells MC. In active regions where element isolation insulating layers 21 are not provided in a surface region of the semiconductor substrate 20, n-channel MOS transistors 60 are provided.

Specifically, a source region 64 and a drain region 65 which are formed to be apart from each other are provided in the semiconductor substrate 20. An n-type diffusion region is used for each of the source regions 64 and the drain regions 65. A gate electrode 62 is provided on the semiconductor substrate 20 between the source region 64 and the drain region 65 through a gate insulating film 61. In the gate electrode 62, a polysilicon electrode 62A, a barrier film 62B, and a metal gate electrode 62C are stacked like the select transistor 22. An upper surface and a side surface of each gate electrode 62 are covered with a gate cap layer 63.

A contact 67 having a bottom surface and a side surface covered with a barrier film 66 is provided on each drain region 65. The same materials as those of the barrier films 30 and the cell contacts 31 in the memory cell array 11 are used for the barrier films 66 and the contacts 67. The interlayer insulating layer 32 is provided between the barrier films 66. The protective film 33 is provided on each interlayer insulating layer 32, and the interlayer insulating layer 36 is provided on the protective film 33.

Each dummy MTJ element 68 is provided in a region which is a part of the upper side of the interlayer insulating layer 36. The dummy MTJ element 68 has the same stacked structure as the MTJ element 37, and it is arranged on the same level as the MTJ element 37. The dummy MTJ element 68 is formed into a non-magnetic body. In non-magnetic body processing of the dummy MTJ element 68, the dummy MTJ element 68 having the same stacked structure as the MTJ element 37 is formed, and then the dummy MTJ element 68 is applied with a laser beam. As a result, a temperature of the dummy MTJ element 68 is increased (e.g., 45 degrees or above), whereby the dummy MTJ element 68 is formed into the non-magnetic body. The protective film 38 is provided on a side surface of the dummy MTJ element 68 like the MTJ element 37. The protective film 38 is provided in some regions (where the dummy MTJ element 68 is not provided) on the interlayer insulating layers 36, and the interlayer insulating layer 39 is provided on the protective film 38.

The protective film 42 is provided on the dummy MTJ element 68 and the interlayer insulating layer 39, and the interlayer insulating layer 43 is provided on the protective film 42. The protective film 47 is provided on the interlayer insulating layer 43, and the interlayer insulating layer 48 is provided on the protective film 47.

Contacts 72 each having a bottom surface and a side surface covered with a barrier film 71 are provided in the interlayer insulating layer 48. The same materials as those of the barrier film 46 and each bit line in the memory cell array 11 are used for the barrier film 71 and each contact 72, and the barrier film 71 and each contact 72 belong to the same level wiring layer as the bit line pairs BL and /BL.

Each contact 67 and each contact 72 are electrically connected to each other through a contact 70 having a bottom surface and a side surface covered with a barrier film 69. The same materials as those of the barrier film 51 and the bit line contacts 52 in the memory cell array 11 are used for the barrier film 69 and the contacts 70. It is to be noted that each contact 70 and each dummy MTJ element 68 are electrically separated from each other by the protective film 38.

A protective film 53 made of, e.g., a silicon nitride (SiN) is provided on each contact 72 and the interlayer insulating layer 48. A wiring layer 74 having a bottom surface and a side surface covered with a barrier layer 73 is provided on each contact 72 and in the protective film 53. The wiring layer 74 is electrically connected to an upper wiring layer.

(Manufacturing Method)

Figure 9:
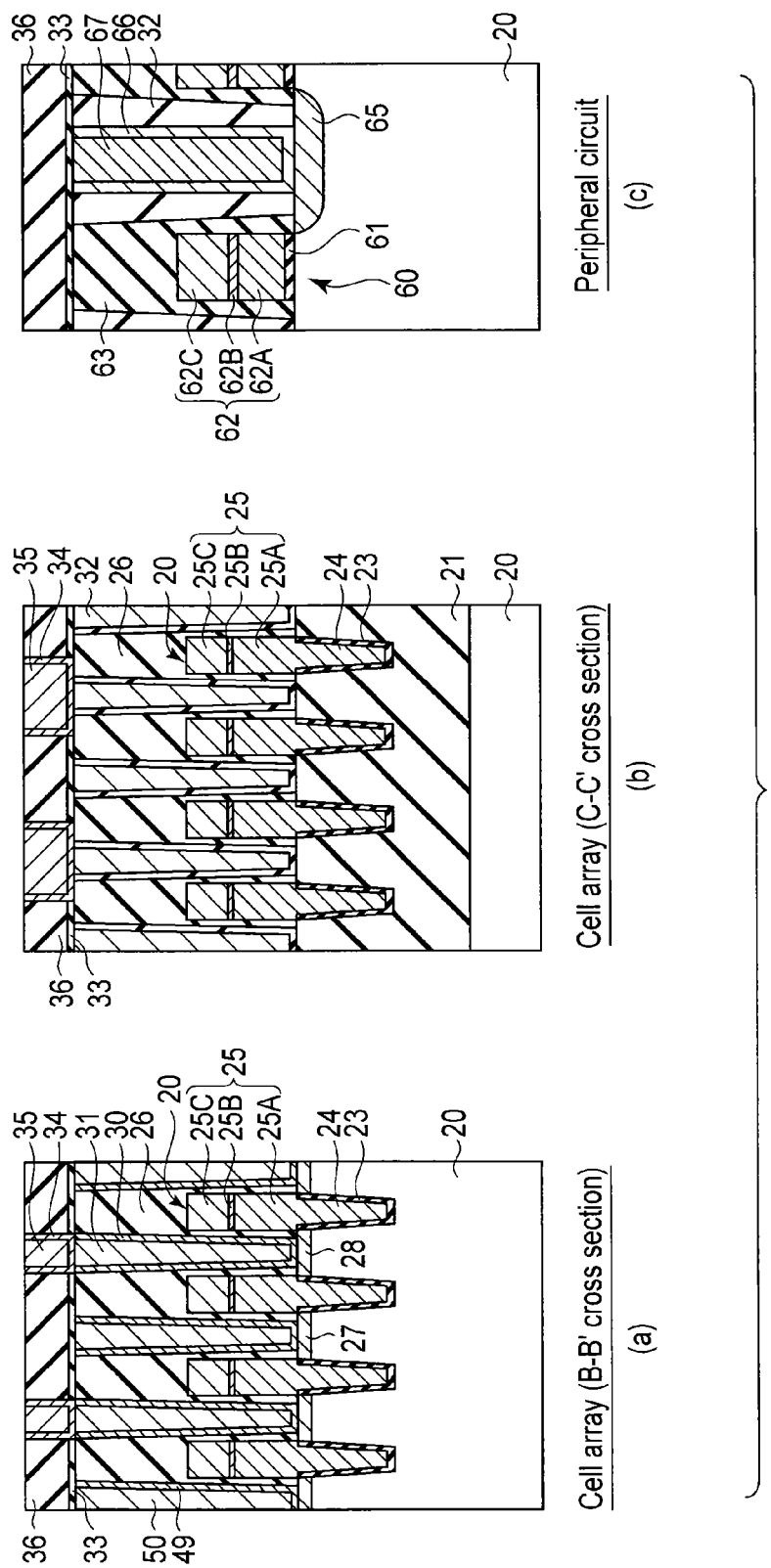
FIG. 9 is a view showing a manufacturing step of the MRAM according to the first embodiment.

A manufacturing method of the thus configured MRAM 10 will now be described with reference to the drawings. FIG. 9(a) is a cross-sectional view of the memory cell array 11 taken along the line B-B' of FIG. 2. FIG. 9(b) is a cross-sectional view of the memory cell array 11 taken along the line C-C' of FIG. 2. FIG. 9(c) is a cross-sectional view of the peripheral circuit 12.

The select transistor 22 of the memory cell array 11 and the MOS transistor 60 of the peripheral circuit 12 are formed on the semiconductor substrate 20 by using a general manufacturing process. Subsequently, the protective film 33 and the interlayer insulating layer 36 are formed on the select transistor 22 and the MOS transistor 60. Then, the barrier film 34 is formed on each cell contact 31 and the interlayer insulating layer 36, and each lower electrode 35 is formed on the barrier film 34. Thereafter, upper surfaces of each lower electrode 35 and the interlayer insulating layer 36 are flattened by using, e.g., a CMP (Chemical Mechanical Polishing) method.

Figure 10:
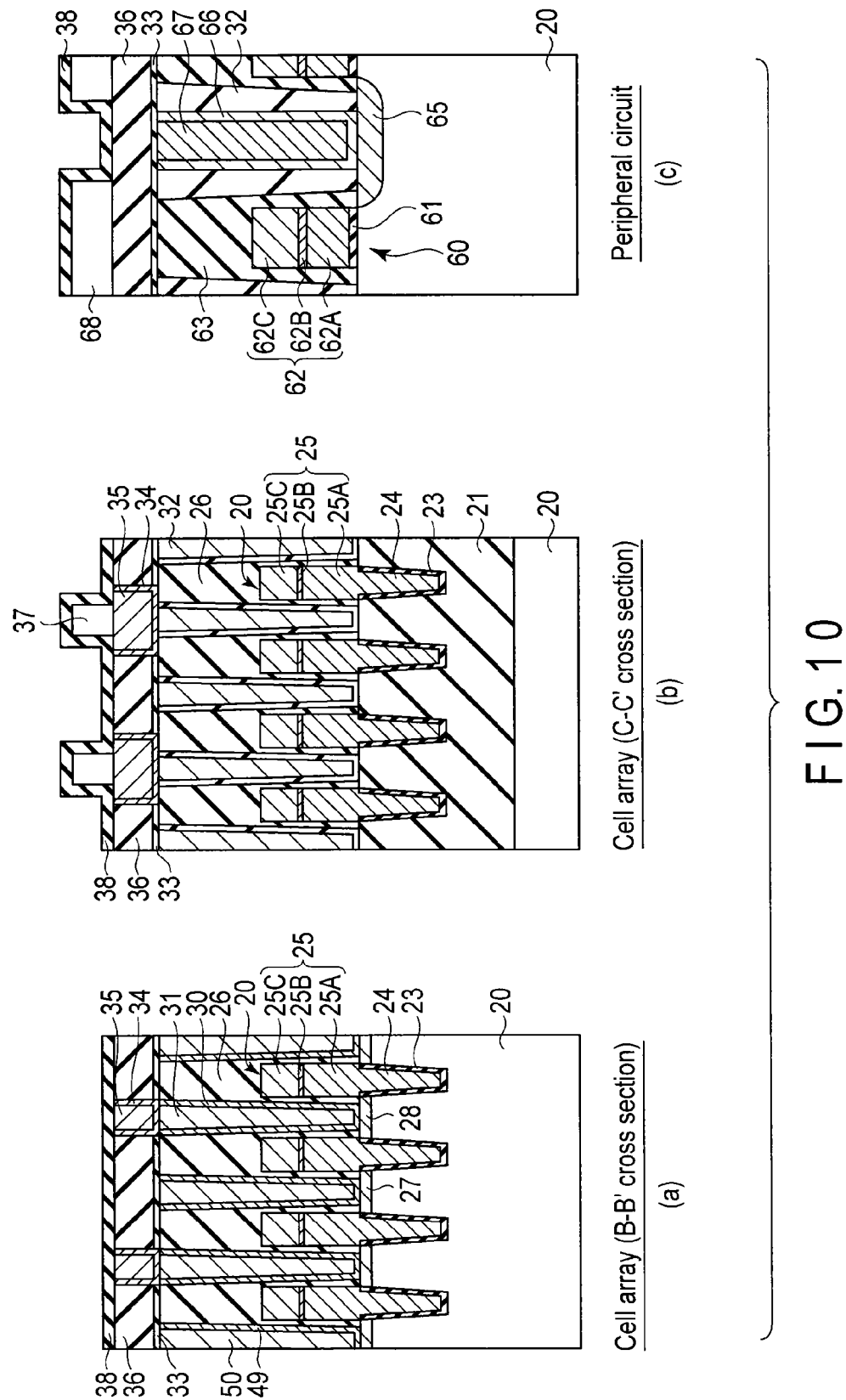
FIG. 10 is a view showing a manufacturing step of the MRAM continued from FIG. 9.

Subsequently, as shown in FIG. 10, an MTJ film including the hard mask layer 37D is deposited on each lower electrode 35 and the interlayer insulating layer 36. Further, by using the hard mask layer 37D as a mask, the MTJ film is processed into a desired shape. At this time, the MTJ film is also formed in a portion of the peripheral circuit 12. The MTJ film of the peripheral circuit 12 is processed such that a region to be formed for contacts connected with the MOS transistors 60 is opened. As a result, the MTJ elements 37 are formed in the cell array section, and the dummy MTJ elements 68 are formed in the peripheral circuit section. Subsequently, the protective films 38 are formed in the cell array section and the peripheral circuit section.

Then, as shown in FIG. 11, the interlayer insulating layers 39 are formed in the cell array section and the peripheral circuit section. Then, by using, for example, the CMP method and the hard mask layer 37D as a stopper, the cell array section and the peripheral circuit section are collectively flattened, thereby exposing the MTJ elements 37 and the dummy MTJ elements 68.

Here, in this embodiment, since the dummy MTJ elements 68 are formed in the peripheral circuit section, an area ratio (a covering rate of the MTJ portions) occupied by the MTJ elements 37 and the dummy MTJ elements 68 with respect to the entire apparatus including the cell array section and the peripheral circuit section increases. Therefore, at the time of the CMP process of FIG. 11, processing with high flatness can be realized. As a result, flatness of the MTJ elements 37 and the dummy MTJ elements 67 can be improved.

Figure 12:
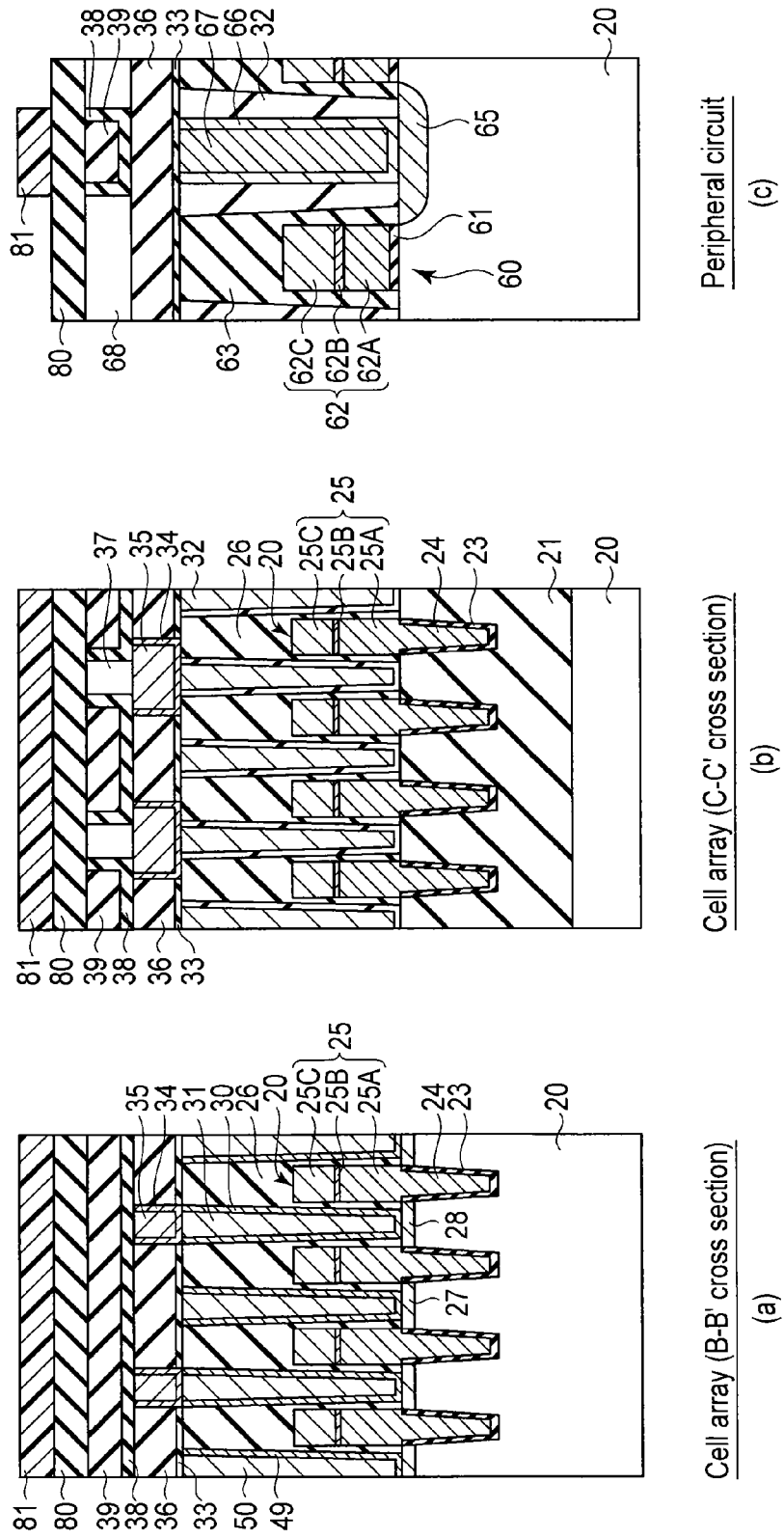
FIG. 12 is a view showing a manufacturing step of the MRAM continued from FIG. 11.
Figure 13:
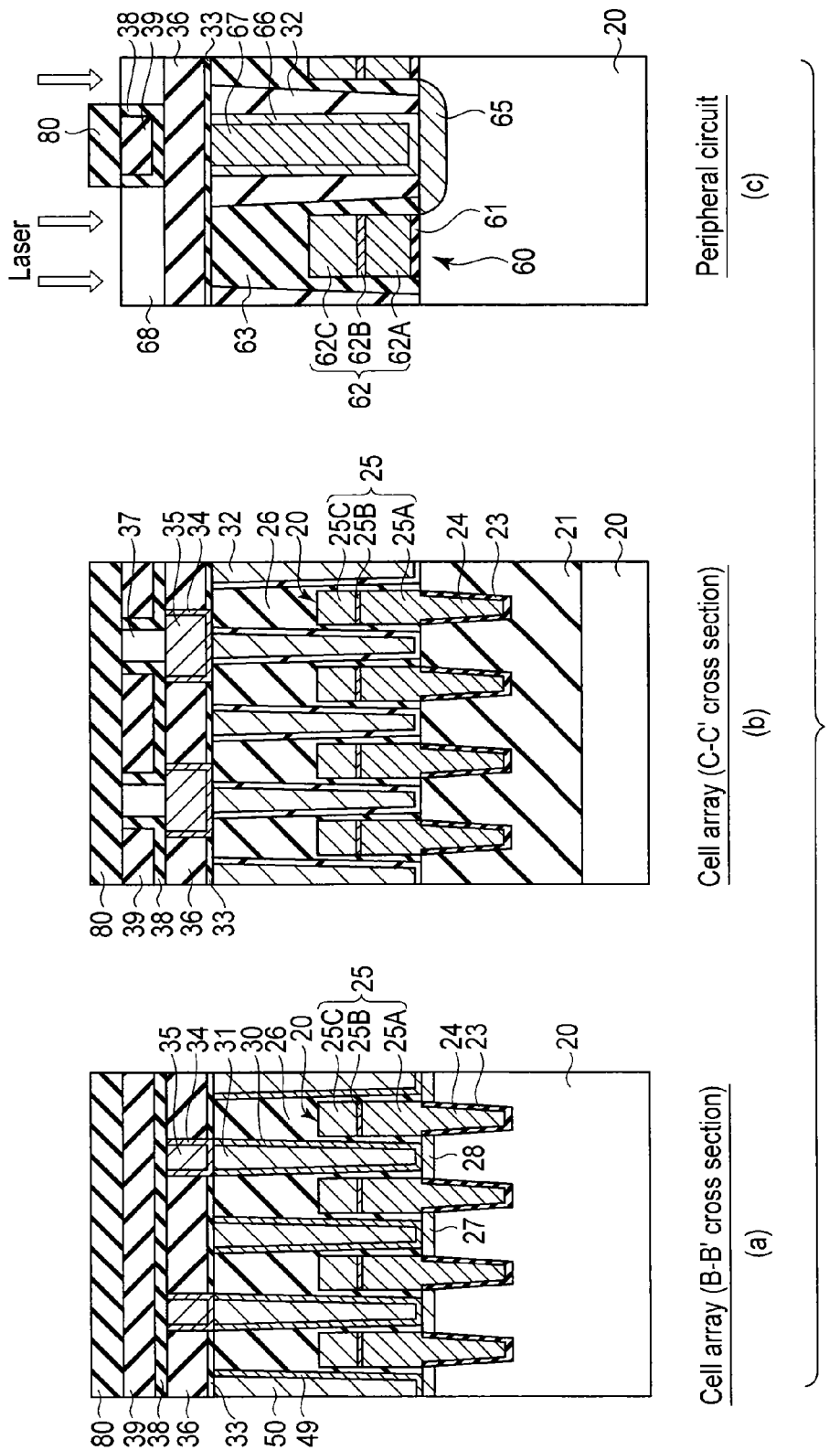
FIG. 13 is a view showing a manufacturing step of the MRAM continued from FIG. 12.

Subsequently, as shown in FIG. 12, a hard mask layer 80 is formed in the cell array section and the peripheral circuit section. Then, by using a lithography method, a resist layer 81, which exposes only above each dummy MTJ element 68, is formed on the hard mask layer 80. Thereafter, as shown in FIG. 13, the hard mask layer 80 is processed by using the resist layer 81 as a mask, thereby exposing each dummy MTJ element 68. Then, the resist layer 81 is removed.

Subsequently, each dummy MTJ element 68 is applied with a laser beam to heat each dummy MTJ element 68 to a high temperature, e.g., 45 degrees or above. As a result, the dummy MTJ element 68 is formed into a non-magnetic body. At this time, since each dummy MTJ element is applied with the laser beam and each MTJ element 37 is covered with the hard mask layer 80, each MTJ element 37 is not formed into a non-magnetic body. It is to be noted that a material having a high laser wavelength absorption factor, e.g., a graphite-based material is preferable as a material of the hard mask layer 80. When such a material is used for the hard mask layer 80, each MTJ element 37 can be prevented from being formed into the non-magnetic body. Thereafter, the hard mask layer 80 is removed.

Figure 14:
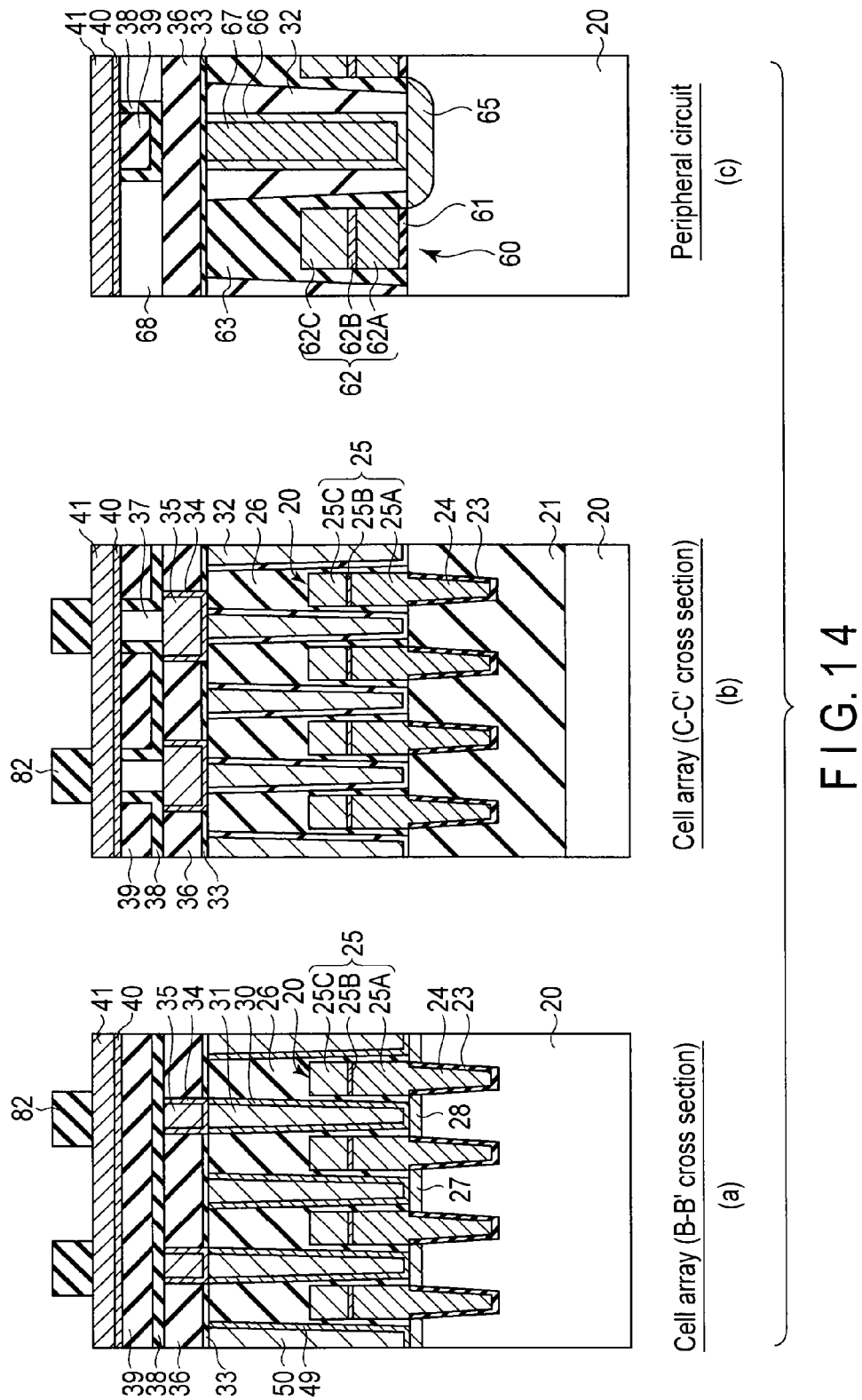
FIG. 14 is a view showing a manufacturing step of the MRAM continued from FIG. 13.

Then, as shown in FIG. 14, a material for the barrier films 40 and a material for the upper electrodes 41 are sequentially deposited on the entire surface of the device. Subsequently, by using the lithography method and the RIE method, the hard mask layer 82, which covers a region to be formed for the upper electrodes 41, are formed on the material of the upper electrodes 41.

Subsequently, as shown in FIG. 15, by using the hard mask layer as a mask, the barrier films 40 and the upper electrodes 41 is processed. Then, the protective film 42 is formed on the entire surface of the device. Here, in this embodiment, since the MTJ elements 37 is flattened by utilizing the dummy MTJ elements 68, the MTJ elements 37 have the improved flatness, and hence contact properties between the MTJ elements 37 and the upper electrodes 41 (specifically, the barrier films 40) are improved.

Figure 16:
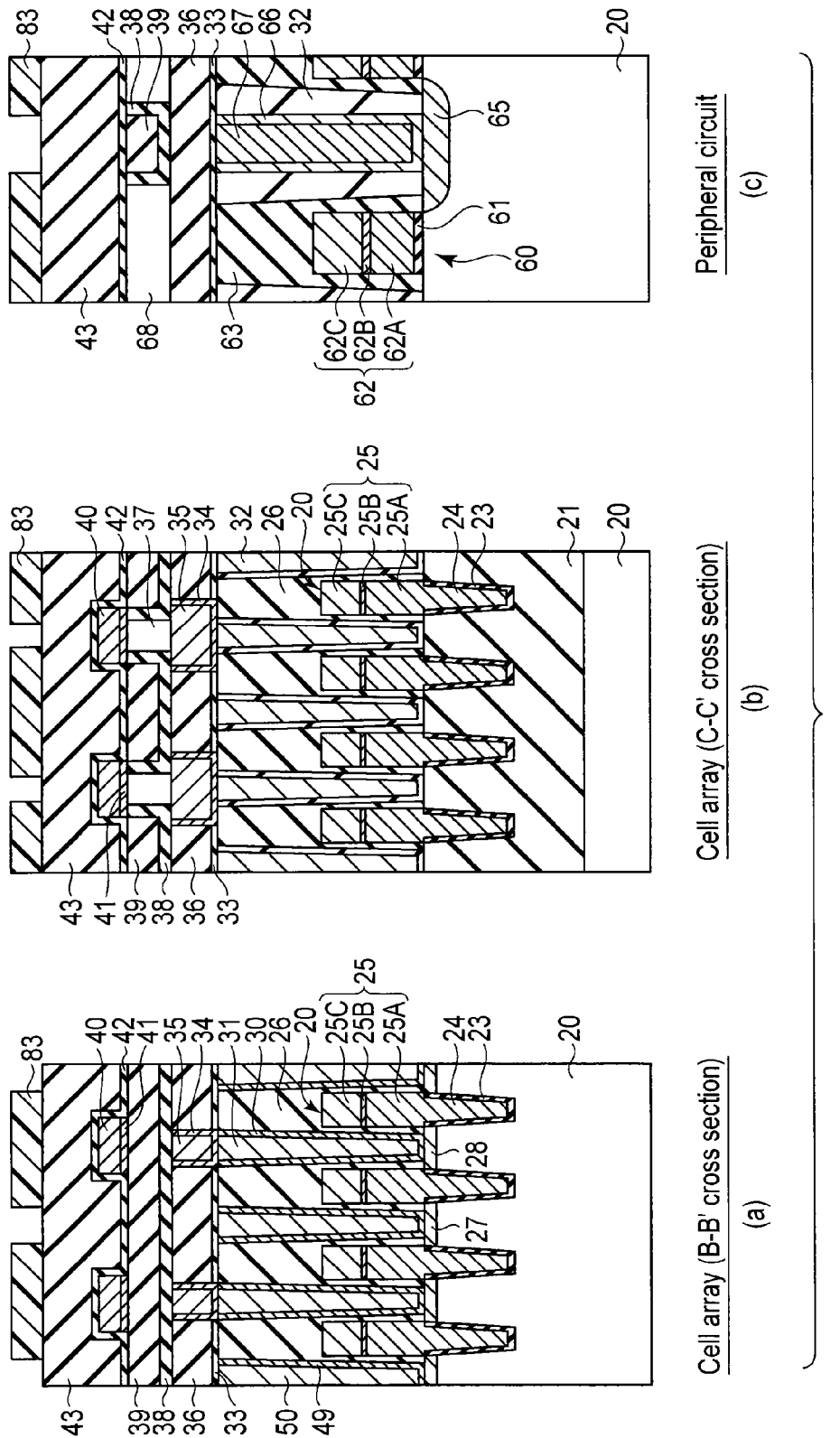
FIG. 16 is a view showing a manufacturing step of the MRAM continued from FIG. 15.

Then, as shown in FIG. 16, the interlayer insulating layer 43 is formed on the entire surface of the device. Subsequently, by using the lithography method, the resist layer 83, which exposes a region to be formed for contact, is formed on the interlayer insulating layer 43.

Figure 17:
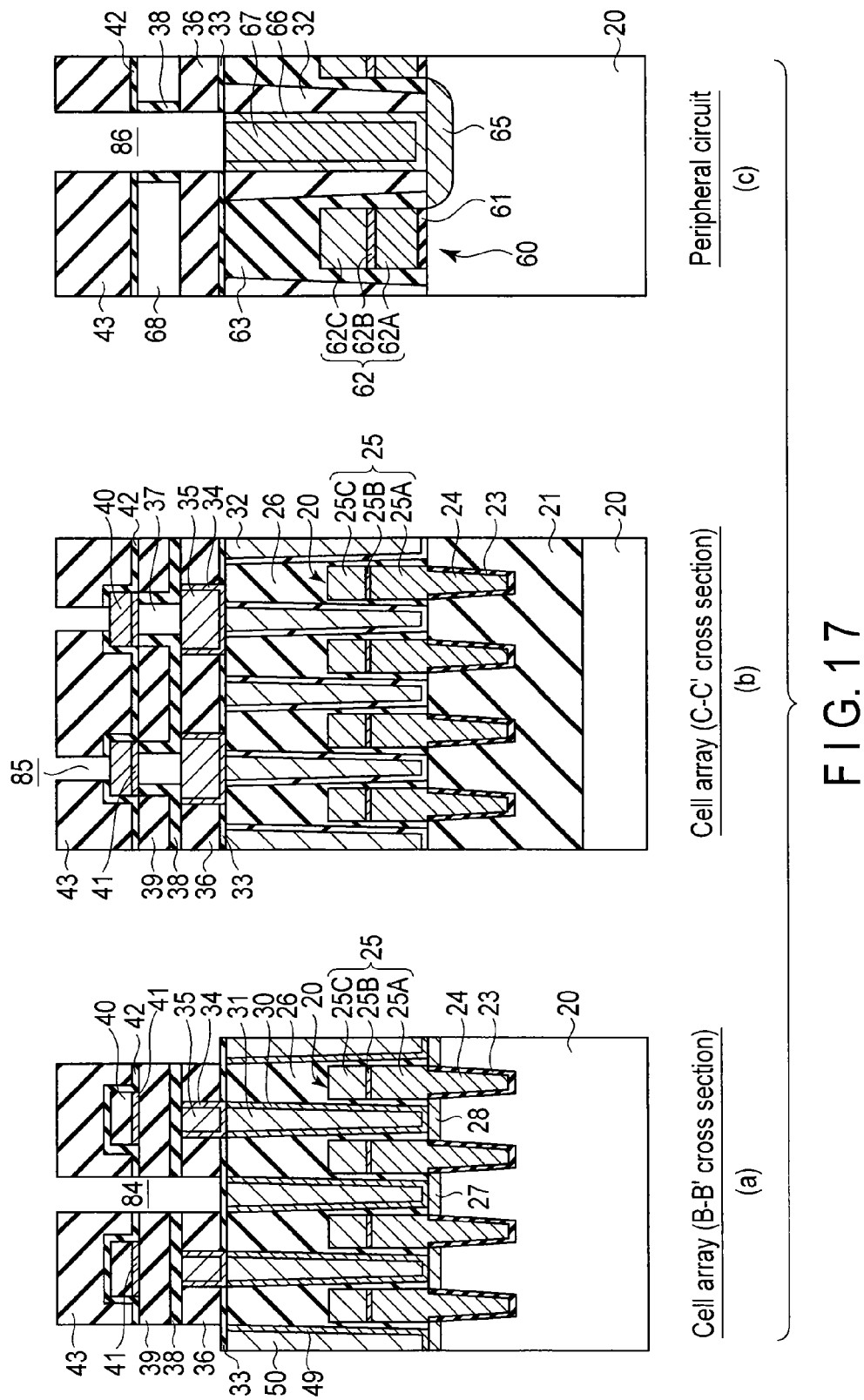
FIG. 17 is a view showing a manufacturing step of the MRAM continued from FIG. 16.

Then, as shown in FIG. 17, by using the resist layer 83 as a mask and, for example, the RIE method, openings 84 each reaching the cell contact 50, openings 85 each reaching the upper electrode 41, and openings 86 each reaching the contact 67 are formed in the interlayer insulating layer. Thereafter, the resist layer 83 is removed.

Figure 18:
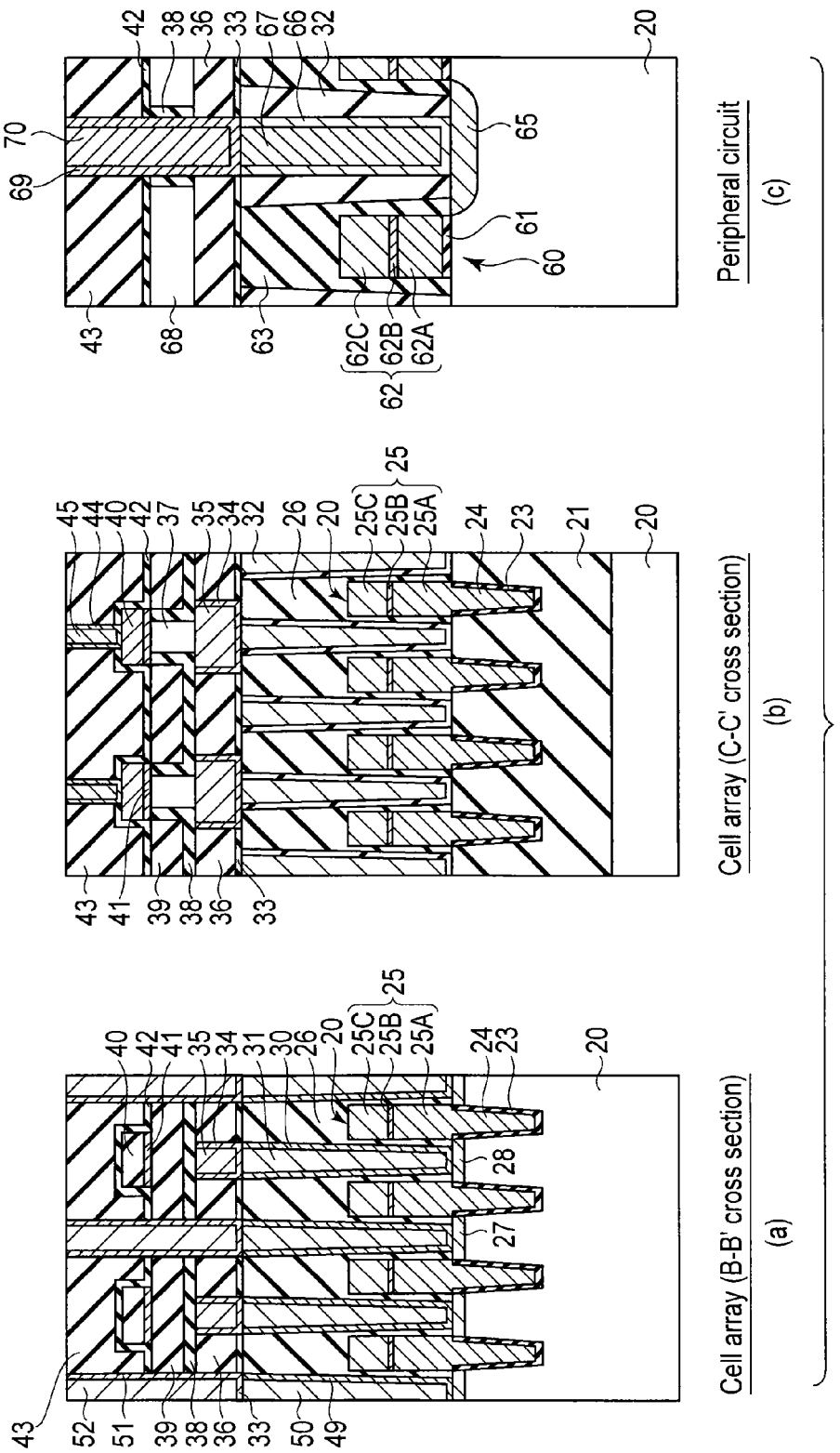
FIG. 18 is a view showing a manufacturing step of the MRAM continued from FIG. 17.

Subsequently, as shown in FIG. 18, the openings 84 to 86 are filled with a barrier film material and a contact material. As a result, the barrier film 51 and the bit line contact 52 are formed in the opening 84, the barrier film 44 and the bit line contact 45 are formed in the opening 85, and the barrier film 69 and the contact 70 are formed in the opening 86. Thereafter, a general manufacturing process is adopted to form the bit lines.

(Effect)

As described above, in the first embodiment, in the MRAM 10 comprising the cell array section (the memory cell array 11) and the peripheral circuit section (the peripheral circuit 12) on the same semiconductor substrate 20, when forming each MTJ element (magnetoresistive element) 37 in the cell array section, each dummy MTJ element 68 which has the same stacked structure as the MTJ element 37 and is level with the MTJ element 37 are formed in the peripheral circuit section. As a result, an area ratio (a covering rate of the MTJ portions) occupied by the MTJ elements 37 and the dummy MTJ elements 68 with respect to a region including the cell array section and the peripheral circuit section increases. Further, for example, when the CMP method is adopted to collectively flatten the cell array section and the peripheral circuit section, the upper surfaces of the MTJ elements 37 are flattened. Then, the upper electrodes 41 are formed on the MTJ elements 37.

Therefore, according to the first embodiment, since the flatness of the MTJ elements 37 is improved, the contact properties between the MTJ elements 37 and the upper electrodes 41 can be improved. As a result, the MRAM 10 having a reduced variation in electrical characteristics can be manufactured.

Furthermore, when the flatness of the MTJ elements 37 is improved, an exposure margin of upper layers of the MTJ elements 37 is improved. As a result, when the contacts or the wiring layers formed after the upper electrodes are processed, excellent processed shapes can be obtained. As a result, crosstalk (leak) between the wiring lines can be decreased, thereby manufacturing the MRAM 10 having a reduced variation in transistor size.

It is to be noted that each dummy MTJ element 68 is formed into a non-magnetic body, and hence the dummy MTJ elements 68 do not affect circuit characteristics in the peripheral circuit 12.

[Second Embodiment]

In a second embodiment, MTJ elements 37 are flattened, and then dummy MTJ elements 68 are removed. A manufacturing method of an MRAM 10 according to the second embodiment will now be described hereinafter with reference to the drawings. FIG. 19(*a*) is a cross-sectional view of the memory cell array 11 taken along the line B-B' of FIG. 2. FIG. 19(*b*) is a cross-sectional view of the memory cell array 11 taken along a line C-C' of FIG. 2. FIG. 19(*c*) is a cross-sectional view of a peripheral circuit 12.

In the second embodiment, the dummy MTJ elements 68 have the same planar shape as that of the MTJ elements 37 and arranged with the same pitch as that of the MTJ elements 37. A contact 91 having a bottom surface and a side surface covered with a barrier film 90 is provided on a contact 67 and in an interlayer insulating layer 36. The contact 91 belongs to the same level wiring layer as each lower electrode 35 of the memory cell array 11, and the same materials for the barrier film 34 and the lower electrode 35 are used for the barrier film 90 and the contact 91, respectively.

Manufacturing steps from the beginning to flattening the MTJ elements 37 and the dummy MTJ elements 68 are equal to those in the manufacturing method according to the first embodiment. Subsequently, by using the lithography method and the RIE method, a hard mask layer 92 that allows the dummy MTJ elements 68 to be exposed is formed on an interlayer insulating layer 39. For example, amorphous silicon is used for the hard mask layer 92.

Then, as shown in FIG. 20, by using e.g., the RIE method and the hard mask layer 92 as a mask, the dummy MTJ elements 68 are removed. As a result, regions from which the dummy MTJ elements 68 have been removed serve as openings 93. A planar shape and a cross-sectional shape of this opening 93 are equal to the planar shape and the cross-sectional shape of the MTJ element 37.

Subsequently, as shown in FIG. 21, barrier films 40 and upper electrodes 41 electrically connected to the MTJ elements 37 are formed. At this time, each opening 93 is filled with a barrier film material 94 and an upper electrode material 95. Subsequent manufacturing steps are equal to those in the first embodiment. Thereafter, general manufacturing steps are adopted to form bit lines.

As described above, according to the second embodiment, when flatness of the MTJ elements 37 is improved, contact properties between the MTJ elements 37 and the upper electrodes 41 can be improved. As a result, it is possible to manufacture the MRAM 10 whose electrical characteristics hardly vary.

Further, since the dummy MTJ elements 68 can be removed, laser processing like the first embodiment is not required, thereby preventing the electrical characteristics of the MRAM 10 from being deteriorated.

Meanwhile, considering increasing a covering rate of the dummy MTJ elements 68 to prevent a CMP margin from being deteriorated, it is preferable to arrange the dummy MTJ elements 68 with the same pitch as that of the MTJ elements 37 in the memory cell array 11 as shown in FIG. 19.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a magnetoresistive element provided in a cell array section on a semiconductor substrate;
   an upper electrode provided on the magnetoresistive element; and
   a dummy magnetic tunnel junction (MTJ) element provided in a peripheral circuit section on the semiconductor substrate, having the same stacked structure as the magnetoresistive element, and arranged at the same level as the magnetoresistive element,
   wherein the dummy magnetic tunnel junction (MTJ) element is formed into a non-magnetic body.

2. The magnetic memory of claim 1, wherein the magnetoresistive element comprises a reference layer having an invariable direction of magnetization, a recording layer having a variable direction of magnetization, and a non-magnetic layer provided between the reference layer and the recording layer.

3. The magnetic memory of claim 1, further comprising:
   a lower electrode provided in the cell array section; and
   an insulating layer provided around the lower electrode and in the peripheral circuit section,
   wherein the magnetoresistive element is provided on the lower electrode, and
   the dummy MTJ element is provided on the insulating layer.

4. The magnetic memory of claim 1, further comprising:
   a select transistor provided in the cell array section and electrically connected to the magnetoresistive element; and
   a peripheral transistor provided in the peripheral circuit section.

* * * * *